United States Patent [19]

Song

[11] Patent Number: 5,471,088
[45] Date of Patent: Nov. 28, 1995

[54] SEMICONDUCTOR PACKAGE AND METHOD FOR MANUFACTURING THE SAME

[75] Inventor: Chi J. Song, Daejon, Rep. of Korea

[73] Assignee: Goldstar Electron Co., Ltd., Choongchungbook-do, Rep. of Korea

[21] Appl. No.: 409,911

[22] Filed: Mar. 23, 1995

Related U.S. Application Data

[63] Continuation of Ser. No. 147,265, Nov. 5, 1993, abandoned.

[30] Foreign Application Priority Data

Nov. 7, 1992 [KR] Rep. of Korea ............... 20847/1992

[51] Int. Cl.⁶ ........................... H01L 23/48; H01L 21/44
[52] U.S. Cl. ................ 257/668; 257/670; 257/672; 257/735; 257/773; 257/783; 257/787; 437/180; 437/182; 437/211; 437/224
[58] Field of Search ................................. 257/668, 670, 257/672, 735, 773, 783, 787; 437/180, 182, 211, 224

[56] References Cited

U.S. PATENT DOCUMENTS

| | | |
|---|---|---|
| 4,649,415 | 3/1987 | Hebert ........................... 257/672 |
| 5,166,772 | 11/1992 | Soldner et al. . |
| 5,227,232 | 7/1993 | Lim ................................. 257/668 |
| 5,233,221 | 8/1993 | Bregman et al. ............... 257/673 |
| 5,334,873 | 8/1994 | Cha ................................. 257/673 |

*Primary Examiner*—Edward Wojciechowicz
*Attorney, Agent, or Firm*—Lowe, Price, LeBlanc & Becker

[57] ABSTRACT

A semiconductor package having lead bars provided with upper and lower surfaces outwardly exposed, thereby enabling a stacked mounting, a memory extension and a reduction in mounting area.

The semiconductor package is manufactured by attaching a plurality of lead bars arranged in two rows in a facing manner to an upper surface of an adhesive tape, each of the lead bars having a first step and a second step positioned at a higher level than the first step, attaching a semiconductor chip to the first steps of the lead bars by an insulating adhesive, wire-bonding bond pads of the semiconductor chip with the second steps of the lead bars by metal wires, respectively, molding the lead bars, the semiconductor chip and the metal wires together by a molding compound under a condition that upper and lower surfaces of the lead bars are exposed outwardly of the molding compound, and removing the adhesive tape after the molding step.

10 Claims, 3 Drawing Sheets

SEMICONDUCTOR PACKAGE AND METHOD FOR MANUFACTURING THE SAME

This application is a continuation of application Ser. No. 08/147,265 filed Nov. 5, 1993, now abandoned.

BACKGROUND OF THE INVENTION

1. Field of the Invention

The present invention relates to a semiconductor package and a method for manufacturing the same, and more particularly to a semiconductor package having lead bars and a method of manufacturing the same.

2. Description of the Prior Art

Referring to FIG. 1, a conventional semiconductor package is illustrated. As shown in FIG. 1, the semiconductor package includes a lead frame 11 constituted by a plurality of inner leads 3, a plurality of outer leads 4, and a paddle 2 integral with the leads 3 and 4. Semiconductor chips 1 are fixedly mounted on the paddle 2 of the lead frame 11 by means of an adhesive. This mounting of the semiconductor chips 1 is achieved by use of a sawing process. The inner leads 3 which are symmetrically arranged at both sides of the semiconductor chips 1 are electrically connected to connecting terminals of the semiconductor chips 1 by means of metal wires 5 made of gold or aluminum, respectively. This connection of the inner leads 3 is achieved by use of a wire bonding process. The resulting structure is molded in a mould by using a molding resin 6. The molding is carried out such that the outer leads 4 are outwardly protruded from the molded structure. The protruded outer leads 4 are then subjected to a trimming process, a forming process and a plating process. Thus a semiconductor package shown in FIG. 1 is produced.

In manufacture of such a semiconductor package, first, a die bonding process step is carried out for fixedly mounting individual semiconductor chips 1 on the paddle 2 of the lead frame 11 by means of an adhesive by use of the sawing process. Thereafter, a wire bonding process step is performed for electrically connecting bonding pads of the semiconductor chips 1 with the corresponding inner leads 3 of the lead frame 11, respectively. A molding process step is then performed for enclosing a predetermined portion of the resulting structure including the semiconductor chips 1 and the inner leads 3 of the lead frame 11 by a molding compound 6. By this molding, a package is produced. Subsequently, the package is subjected to a trimming process step, a forming process step and a plating process step.

At the trimming and forming process steps, connecting bars (not shown) supporting the paddle 2 and dam bars (not shown) supporting the leads are cut. At these steps, the outer leads 4 are bent to have a predetermined shape. The trimming and forming process steps are individually carried out. According to the bent shape of the outer leads 4, various types of surface-on-mounting packages such as a small out-line J-lead package and a dual in-line package may be obtained. Where a memory extension is desired, the produced semiconductor package is electrically connected to a printed circuit board 8 by use of conductive bumps 7, as shown in FIG. 3.

The semiconductor package assembled in the above-mentioned manner is used after subjecting an electrical characteristic test. The semiconductor package is mounted in a surface-on-mounting manner or a insertion manner to a circuit board of various appliances or sets, in accordance with the type thereof, to perform a desired operation.

However, the above-mentioned conventional semiconductor package is expensive due to the use of complex manufacture process steps. Since the metallic paddle 2 is disposed in the package, a breakage of the package may occur due to a thermal expansion coefficient difference between the semiconductor chip 1 and the paddle 2 when the package is subjected to a reflow soldering process. Furthermore, the elongated metal wires 5 may degrade the electrical characteristic of the semiconductor chip.

In this semiconductor package, a larger mounting area is required when the semiconductor package is mounted on a printed circuit board. This is because leads of the lead frame are excessively protruded outwardly of a molding portion of the package. In addition, it is impossible to mount semiconductor packages in a stacked manner because leads are arranged along the bottom of each semiconductor package.

SUMMARY OF THE INVENTION

Therefore an object of the invention is to provide a semiconductor package having lead bars in place of a lead frame, thereby capable of reducing a mounting area.

Another object of the invention is to provide a semiconductor package capable of eliminating the use of trimming and forming process steps, thereby simplifying the overall process steps and saving the manufacture cost.

Another object of the invention is to provide a semiconductor package having lead bars outwardly exposed at upper and lower surfaces of the package, thereby enabling a stacked mounting and a memory extension.

In accordance with the present invention, these objects can be accomplished by providing a semiconductor package comprising: a semiconductor chip having a plurality of bonding pads: a plurality of lead bars adapted to provide an electrical connection of said semiconductor chip with an external circuit, each of said lead bars having a stepped surface; connecting means for electrically connecting the semiconductor chip with said lead bars; and a molding resin adapted to enclose the semiconductor chip and the lead bars.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
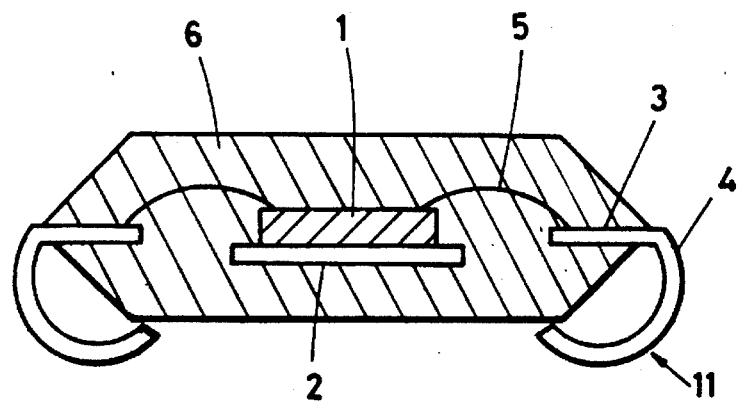
FIG. 1 is a sectional view of a conventional semiconductor package.
Figure 2:
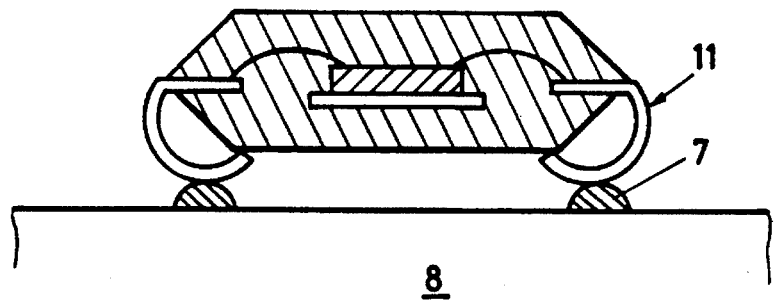
FIG. 2 is a sectional view illustrating a condition that the conventional semiconductor package is mounted on a printed circuit board.
Figure 3:
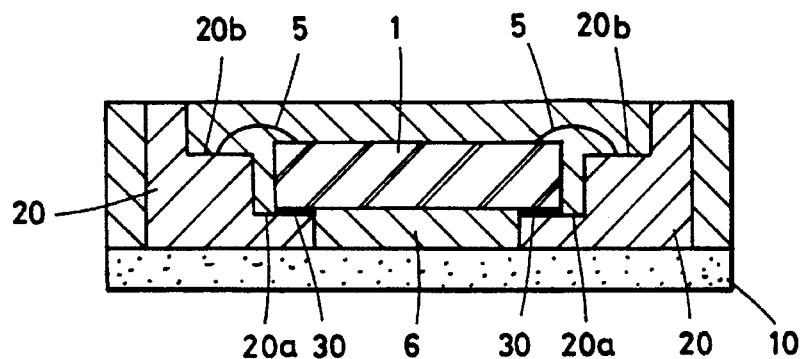
FIG. 3 is a sectional view of a semiconductor package in accordance with an embodiment of the present invention.

FIG. 3 is a sectional view illustrating a semiconductor package in accordance with an embodiment of the present invention. As shown in FIG. 3, the semiconductor package comprises a plurality of lead bars 20 attached to the upper surface of a polyimide-based adhesive tape 10. The lead bars 20 are arranged in two rows in a facing manner at both sides of the polyimide-based adhesive tape 10. Each lead bar 20 has a stepped shape including a first steps 20a and a second step 20b positioned a higher level than the first step 20a. To the first steps 20a of lead bars 20, a semiconductor chip 1 is attached by means of insulating tapes 30. The semiconductor chip 1 is electrically connected to all the second steps 20b of lead bars 20 by means of metal wires 5. The semiconductor package further comprises a molded structure obtained by use of a molding compound 6. In the semiconductor package, the upper and lower surfaces of the lead bars 20 are exposed outwardly of the molded structure having a height defined between the upper and lower surfaces of lead bars 20.

Figure 4:
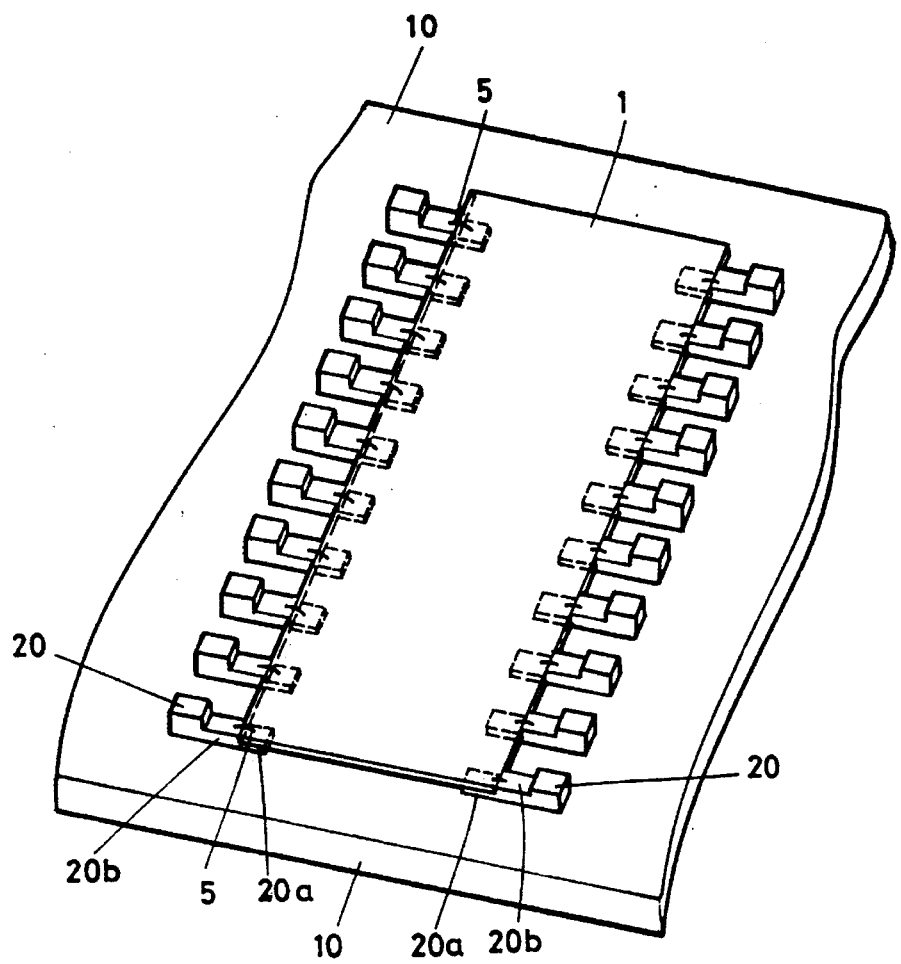
FIG. 4 is a perspective view illustrating a condition that the semiconductor package of FIG. 3 is attached to an adhesive tape.
Figure 5:
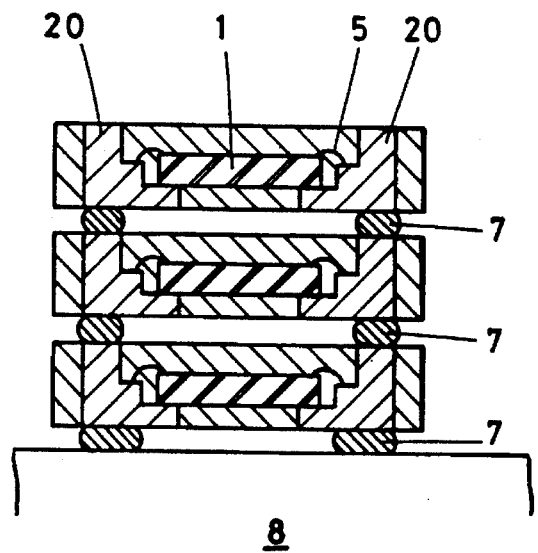
FIG. 5 is a sectional view illustrating a condition that the semiconductor package of FIG. 3 is mounted on a printed circuit board.

FIG. 4 is a perspective view of the lead bars 20 attached to the polyimide-based adhesive tape 10 and connected to the semiconductor chip 1. FIG. 5 is a sectional view of an extended condition of semiconductor chips mounted on a printed circuit board in accordance with the present invention. The mounting of semiconductor packages manufactured in accordance with the present invention on the printed circuit board is achieved by conductive bumps made of a material of Pb or PbSn.

In manufacture of the semiconductor package having the above-mentioned construction in accordance with the present invention, first, a step of attaching a plurality of spaced lead bars 20 on the polyimide-based adhesive tape 10 is carried out. The lead bars 20 are arranged in two rows in a facing manner at both sides of the polyimide-based adhesive tape 10. Thereafter, a bonding step is performed for bonding the semiconductor chip 1 on all the first steps 20a of lead bars 20 by use of insulating adhesive or insulating tapes. A wire bonding step is then carried out for electrically connecting the second steps 20B of lead bars 20 with the bonding pads of semiconductor chip 1 by use of metal wires 5, respectively. Subsequently, a molding step is performed for molding the resultant structure by use of the molding compound 6 to form a molded structure having a height defined between the upper and lower surfaces of the lead bars 20. Finally, a step is carried out for removing the polyimide-based adhesive tape 10 attached to the lower surfaces of lead bars 20.

Where the capacity of the semiconductor chip 1 is to be extended, semiconductor packages having the above-mentioned construction are vertically stacked. In this case, conductive bumps 7 are attached to the lower surface of each lead bar 20 of each semiconductor package. Even though the capacity of the semiconductor chip 1 is extended in the above-mentioned manner, a poor contact occurs scarcely upon soldering because the lower surface of each lead bar 20 has a larger surface area than the upper surface of each lead bar 20, thereby providing a larger margin to attach the conductive bump 7.

Figure 6:
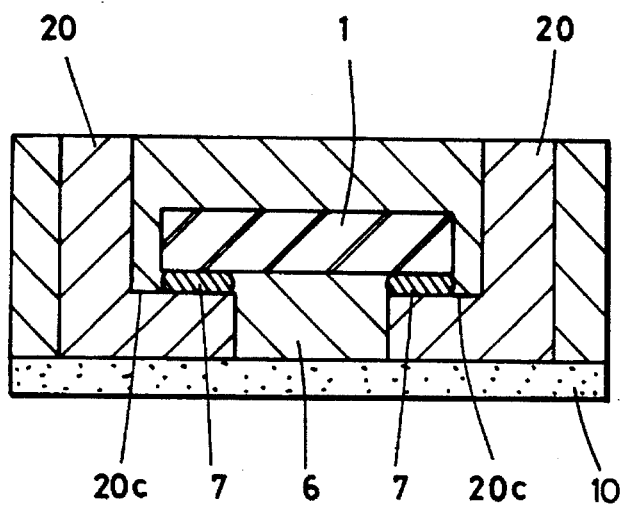
FIG. 6 is a sectional view of a semiconductor package in accordance with another embodiment of the present invention.

FIG. 6 is a sectional view of a semiconductor package in accordance with another embodiment of the present invention. In FIG. 6, elements corresponding to those in FIG. 3 are denoted by the same reference numerals. As shown in FIG. 6, the semiconductor package comprises a plurality of L-shaped lead bars 20 attached to the upper surface of a polyimide-based adhesive tape 10. Each lead bar 20 has a semiconductor chip-connecting portion 20c. The lead bars 20 are arranged in two rows in a facing manner at both sides of the polyimide-based adhesive tape 10. To the connecting portions 20c of lead bars 20, a semiconductor chip 1 is electrically connected by means of conductive bumps 7. The semiconductor package further comprises a molded structure obtained by use of a molding compound 6. In the semiconductor package, the upper and lower surfaces of the lead bars 20 are exposed outwardly of the molded structure having a height defined by the upper and lower surfaces of lead bars 20. In accordance with this embodiment, the semiconductor chip 1 is electrically connected with the lead bars 20 by conductive bumps 7 in a direct manner without using any wire bonding process step. Accordingly, it is possible to reduce the number of process steps and the mounting area over the afore-mentioned embodiment.

In manufacture of the semiconductor package having the above-mentioned construction of FIG. 6 in accordance with the present invention, first, a step of attaching a plurality of spaced lead bars 20 on the polyimide-based adhesive tape 10 is carried out. The lead bars 20 are arranged in two rows in a facing manner at both sides of the polyimide-based adhesive tape 10. Thereafter, a step is performed for electrically connecting bonding pads provided at the lower surface of the semiconductor chip 1 on the semiconductor chip-connecting portion 20c of lead bars 20 by use of conductive bumps 7, respectively. A molding step is then performed for molding the resultant structure by use of the molding compound 6 to form a molded structure having a height defined between the upper and lower surfaces of the lead bars 20. Finally, a step is carried out for removing the polyimide-based adhesive tape 10 attached to the lower surfaces of lead bars 20.

As apparent from the above description, the present invention provides a semiconductor package having lead bars capable of eliminating outer leads protruded outwardly of the package when the package is mounted on a circuit board, thereby reducing the mounting area. Since no paddle is used in accordance with the present invention, rate of poor products can be greatly reduced. The occupying rate of the semiconductor chip in the package is also reduced. Moreover, an electrical characteristic is improved because the distance between the semiconductor chip and each bonding pad is reduced. The present invention requires no use of trimming and forming process steps. As a result, it is possible to eliminate a micro gap caused by the forced forming process step. This provides an improvement in wetproof property. The leads are outwardly exposed at the upper and lower surfaces of the package so that they serve as heat sinks for outwardly discharging heat out of the package. Where the capacity of the semiconductor chip is to be extended, the extension in capacity can be achieved by vertically stacking semiconductor packages and using conductive bumps made of Pb or PbSn. In accordance with the present invention, a high density mounting can be obtained because leads are not protruded upon mounting the package on a printed circuit board. Where semiconductor chips are attached to both surfaces of a printed circuit board or a memory card, the mounting of semiconductor package and the stacking of semiconductor packagers for a memory extension can be possible at either of the upper surface or the lower surface of the printed circuit board or the memory card because the lead bars are outwardly exposed at both the upper and lower surfaces of the semiconductor package. In other words, a forward and reverse concept is unnecessary for the semiconductor package of the present invention. In addition, any subsequent process step is not required after the molding process step, in accordance with the present invention. Accordingly, it is possible to expect an effect of reducing labor and occupying space of installation necessary for a package assembling work.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:

a semiconductor chip having a plurality of bonding pads;

a plurality of distinct lead bars, each attached to an adhesive tape, for providing an electrical connection of said semiconductor chip with an external circuit, each of said lead bars having a semiconductor chip-connecting portion; and a molding resin enclosing the semiconductor chip and the lead bars, wherein the lead bars are exposed at an external surface of the molding resin, so that a surface of the lead bars is substantially coplanar with the molding resin.

2. A semiconductor package in accordance with claim 1, wherein each of said lead bars has an L-shape.

3. A semiconductor package comprising:

a plurality of lead bars having an upper surface, a lower surface, a first step and a second step, respectively, wherein the second step is positioned at a higher level than the first step;

a semiconductor chip attached to the first step by means of an insulating adhesive and connected to the second step with a metal wire; and a mold compound adapted to enclose the semiconductor chip and lead bars wherein the upper surface and the lower surface of the lead bars are exposed at an upper surface and a lower surface of the mold compound, so that the upper and lower surfaces of the lead bars are substantially coplanar with the mold compound.

4. A semiconductor package comprising:

a plurality of L-shaped lead bars having an upper surface, a lower surface and a chip connecting portion, respectively;

a semiconductor chip electrically connected to the chip connecting portion with a conductive bump; and a mold compound adapted to enclose the chip and the lead bars wherein the upper surface and the lower surface of the lead bar are exposed at an upper surface and a lower surface of the mold compound, so that the upper and lower surfaces of the lead bars are substantially coplanar with the mold compound.

5. A semiconductor package in accordance with claim 4, wherein said conductive bumps are made of Pb.

6. A semiconductor package in accordance with claim 4, wherein said conductive bumps are made of PbSn.

7. A method for manufacturing a semiconductor package, comprising the steps of:

attaching a plurality of lead bars arranged in two rows in a facing manner to an upper surface of an adhesive tape, each of said lead bars having a first step and a second step positioned at a higher level than said first step;

attaching a semiconductor chip to said first steps of the lead bars by an insulating adhesive;

wire-bonding bond pads of said semiconductor chip with said second steps of the lead bars by metal wires, respectively; and molding the lead bars, the semiconductor chip and the metal wires together by a molding compound under a condition that upper and lower surfaces of the lead bars are exposed outwardly of said molding compound.

8. A method in accordance with claim 7, further comprising the step of removing said adhesive tape after said molding step.

9. A method for manufacturing a semiconductor package comprising the steps of:

attaching a plurality of distinct lead bars arranged in two rows in a facing manner to an upper surface of an adhesive tape, each of said lead bars having a semiconductor chip-connecting portion;

directly electrically connecting bonding pads of said semiconductor chip with said semiconductor chip-connecting portions of the lead bars by conductive bumps, respectively; and molding the resulting structure by a molding compound under a condition that upper and lower surfaces of the lead bars are exposed at an external surface of said molding compound, so that the upper and lower surfaces of the lead bars are substantially coplanar with the molding compound.

10. A method in accordance with claim 9, further comprising the step of removing said adhesive tape after said molding step.

\* \* \* \* \*